(12) United States Patent
Schreiber et al.

(10) Patent No.: US 7,781,679 B1
(45) Date of Patent: *Aug. 24, 2010

(54) DISK DRIVE SUSPENSION VIA FORMATION USING A TIE LAYER AND PRODUCT

(75) Inventors: Christopher Schreiber, Temecula, CA (US); Christopher Dunn, Temecula, CA (US)

(73) Assignee: Magnecomp Corporation, Murrieta, CA (US)

( * ) Notice: Subject to any disclaimer, the term of this patent is extended or adjusted under 35 U.S.C. 154(b) by 947 days.

This patent is subject to a terminal disclaimer.

(21) Appl. No.: 11/340,298

(22) Filed: Jan. 26, 2006

Related U.S. Application Data

(60) Provisional application No. 60/715,854, filed on Sep. 9, 2005.

(51) Int. Cl.
*H05K 1/00* (2006.01)

(52) U.S. Cl. .................. 174/254; 174/255; 174/256; 174/257; 174/259; 174/265; 361/757; 361/771; 361/793; 428/408; 428/457; 360/234.5; 360/245.9; 360/246

(58) Field of Classification Search .............. 174/254, 174/255, 256, 257, 259, 261, 265; 361/793, 361/757, 771; 29/593, 595, 852, 885; 428/408, 428/457; 360/234.5, 245.9, 246
See application file for complete search history.

(56) References Cited

U.S. PATENT DOCUMENTS 3,669,851 A * 6/1972 Garvey .................. 205/151
3,779,891 A * 12/1973 Vegh et al. ............ 204/298.06
3,804,665 A * 4/1974 Chapman .................. 427/250
3,865,703 A * 2/1975 Schenker et al. ........... 205/576
3,980,570 A * 9/1976 Okuda et al. .............. 508/106
4,123,577 A * 10/1978 Port et al. .................. 428/95
4,194,672 A * 3/1980 Uto et al. .................. 228/194
4,232,098 A * 11/1980 Park et al. ................. 429/104
4,288,307 A * 9/1981 Wasa et al. ............. 204/192.13
4,297,436 A * 10/1981 Kubotera et al. ........... 430/319
4,404,074 A * 9/1983 Tomaszewski ............ 205/717
4,416,738 A * 11/1983 Herrmann, Jr. ............ 205/179
4,423,356 A * 12/1983 Sato et al. ................ 315/169.2

(Continued)

OTHER PUBLICATIONS

U.S. Appl. No. 11/485,912, Additive Disk Drive Suspension Manufacturing Using Tie Layers For Vias and Product Thereof.

(Continued)

*Primary Examiner*—Xiaoliang Chen
(74) *Attorney, Agent, or Firm*—Intellectual Property Law Offices of Joel Voeizke, APC

(57) ABSTRACT

A disk drive suspension interconnect, and method therefor. The interconnect has a metal grounding layer, a metal conductive layer and an insulative layer between the metal grounding layer and the conductive metal layer. A circuit component such as a slider is electrically connected to the conductive layer along a grounding path from the circuit component and the conductive layer to the metal grounding layer through an aperture in the insulative layer. For improved electrical connection a tie layer is provided through the insulative layer onto the grounding layer in bonding relation with the ground layer. A conductor is deposited onto both the conductive metal layer and the tie layer in conductive metal layer and tie layer bonding relation, and the circuit component is thus bonded to the grounding layer by the conductor.

20 Claims, 2 Drawing Sheets

U.S. PATENT DOCUMENTS

| | | | | |
|---|---|---|---|---|
| 4,664,759 A * | 5/1987 | Chessin | ................ | 205/218 |
| 4,673,663 A * | 6/1987 | Magnier | ................ | 502/320 |
| 4,681,654 A * | 7/1987 | Clementi et al. | ................ | 216/18 |
| 4,786,762 A * | 11/1988 | Bowsky et al. | ................ | 174/152 GM |
| 4,906,803 A * | 3/1990 | Albrechta et al. | ................ | 174/254 |
| 5,085,926 A * | 2/1992 | Iida et al. | ................ | 428/216 |
| 5,151,827 A * | 9/1992 | Ven et al. | ................ | 359/848 |
| 5,223,669 A * | 6/1993 | Kanba et al. | ................ | 399/276 |
| 5,369,164 A * | 11/1994 | Kroener et al. | ................ | 524/458 |
| 5,371,380 A * | 12/1994 | Saito et al. | ................ | 257/52 |
| 5,397,401 A * | 3/1995 | Toma et al. | ................ | 136/259 |
| 5,405,693 A * | 4/1995 | Dittrich et al. | ................ | 428/355 AC |
| 5,491,036 A * | 2/1996 | Carey et al. | ................ | 428/647 |
| 5,536,549 A * | 7/1996 | Nelson et al. | ................ | 428/846.6 |
| 5,616,424 A * | 4/1997 | Carey et al. | ................ | 428/647 |
| 5,667,849 A * | 9/1997 | Carey et al. | ................ | 427/431 |
| 5,770,090 A * | 6/1998 | Lewis, III | ................ | 210/662 |
| 5,846,648 A * | 12/1998 | Chen et al. | ................ | 428/332 |
| 5,900,126 A * | 5/1999 | Nelson et al. | ................ | 204/192.2 |
| 6,331,208 B1 * | 12/2001 | Nishida et al. | ................ | 117/89 |
| 6,372,116 B1 * | 4/2002 | Kim et al. | ................ | 205/205 |
| 6,515,424 B2 * | 2/2003 | Nakamura et al. | ................ | 315/3 |
| 6,585,874 B2 * | 7/2003 | Moore | ................ | 205/78 |
| 6,696,163 B2 * | 2/2004 | Yang | ................ | 428/458 |
| 6,797,135 B2 * | 9/2004 | Kim et al. | ................ | 204/230.2 |
| 6,797,888 B2 * | 9/2004 | Ookawa et al. | ................ | 174/255 |
| 6,900,967 B1 * | 5/2005 | Coon et al. | ................ | 360/245.9 |
| 6,936,761 B2 * | 8/2005 | Pichler | ................ | 136/256 |
| 6,975,488 B1 * | 12/2005 | Kulangara et al. | ................ | 360/246 |
| 6,995,954 B1 * | 2/2006 | Coon | ................ | 360/245.9 |
| 7,012,017 B2 * | 3/2006 | Brunner et al. | ................ | 438/613 |
| 7,189,917 B2 * | 3/2007 | Okada et al. | ................ | 136/255 |
| 7,320,174 B2 * | 1/2008 | Cowles et al. | ................ | 29/852 |
| 7,379,271 B1 * | 5/2008 | Schreiber et al. | ................ | 360/245.3 |
| 7,451,537 B2 * | 11/2008 | Liu et al. | ................ | 29/595 |
| 7,466,519 B2 * | 12/2008 | Wakaki et al. | ................ | 360/245.9 |
| 2002/0092764 A1 * | 7/2002 | Kim et al. | ................ | 204/230.5 |
| 2004/0130877 A1 * | 7/2004 | Okubora | ................ | 361/793 |
| 2004/0187913 A1 * | 9/2004 | Okada et al. | ................ | 136/255 |
| 2004/0247921 A1 * | 12/2004 | Dodsworth et al. | ................ | 428/544 |
| 2005/0146403 A1 * | 7/2005 | Okubora | ................ | 333/247 |
| 2005/0195528 A1 * | 9/2005 | Bennin et al. | ................ | 360/234.5 |
| 2005/0205172 A1 * | 9/2005 | Coudurier | ................ | 148/403 |
| 2006/0011471 A1 * | 1/2006 | Grippo | ................ | 204/192.15 |
| 2006/0150824 A1 * | 7/2006 | Coudurier | ................ | 99/324 |
| 2006/0278212 A1 * | 12/2006 | Coudurier | ................ | 126/37 R |
| 2007/0236313 A1 * | 10/2007 | Wallis et al. | ................ | 335/220 |
| 2009/0008133 A1 * | 1/2009 | Bullard et al. | ................ | 174/255 |

OTHER PUBLICATIONS

U.S. Appl. No. 12/540,870, Resilient Flying Lead and Terminus for Disk Drive Suspension.
U.S. Appl. No. 12/623,983, Low Impedance, High Bandwidth Disk Drive Suspension Circuit.

* cited by examiner

DISK DRIVE SUSPENSION VIA FORMATION USING A TIE LAYER AND PRODUCT

CROSS-REFERENCE TO RELATED APPLICATIONS

This application claims the benefit of U.S. Provisional Application Ser. No. 60/715,854, filed Sep. 9, 2005.

BACKGROUND OF THE INVENTION

1. Field of the Invention

This invention relates to disk drive suspensions, and more particularly, to improvements in the manufacture of disk drive suspension interconnects to secure better electrical grounding of suspension components such as copper circuit layers to grounded portions of the suspension such as stainless steel layers, to enable increased numbers of copper circuit layers, and further relates to suspension products thus manufactured. In particular, a method is provided to connect the copper circuitry of a component such as a slider with the stainless steel part of the suspension interconnect using vias modified in manufacture to have better electrical connection than available heretofore. In one aspect, the invention provides optimal performance in hard disk drive sliders by improving the electrical grounding thereof through a via having a copper conductor bonded to a stainless steel layer using a tie layer of chromium and optionally a copper flash layer as well.

2. Description of the Related Art

Disk drive suspension interconnects, such as Integrated Lead Suspensions (ILS) for hard disk drives typically have three layers, including a stainless steel foil that provides mechanical properties for the suspension, two or more conductive traces comprising gold plated, patterned copper conductive circuits paths that provide the electrical connection between the read/write head slider and the termination pads of the suspension, and a dielectric layer that provides electrical insulation between the stainless steel foil and the conductive traces.

It is known to be desirable to ground various components of a disk drive suspension such as the body of the read/write head slider. One of the major challenges in the design of hard disk drive suspensions is attaining a suitable, reliable grounding connection between the conductive copper traces connected electrically to the slider and the underlying stainless steel foil layer given the limited space available to make the connection. The difficulty of bonding to stainless steel and dissimilarity of the metals (Cu, Au, SST) pose additional significant challenges to creating a reliable grounding of the slider, but reliable grounding is essential to maintaining the signal fidelity between the read/write head and amplifier.

Among the prior art approaches to solving the slider grounding problem is creating a hole in the dielectric between the slider and the stainless steel foil, typically 25 μm deep, and filling the hole with conductive adhesive to provide an electrical connection between the slider and the stainless steel. This approach is deficient, however, since conductive adhesive connections are typified by very high interconnect resistance resultant from the passive (self-healing) nature of the stainless steel and the lack of a conductive, fully metallic bond between the steel layer and the conductive adhesive. High interconnect resistance limits the quality of the electrical connection to ground and thus slider performance dependent on a good grounding is degraded.

Another approach to slider grounding uses a spanning lead that extends from the slider, beyond the edge of the dielectric layer and opposite the stainless steel layer where it is subsequently bent over onto the stainless steel layer and electrically and mechanically affixed there, using, typically, a conductive polymer. Spanning leads are very fragile and can be easily mis-bent during manufacture causing lowered manufacturing yields. Further, even if perfectly accomplished, the process of physically bending and adhering leads to the stainless steel suspensions is a very labor-intensive process that does not lend itself to high-volume, low-cost manufacturing, such as simultaneous gang bonding of multiple suspensions.

In both of these prior art processes the presence of conductive adhesives can cause increased drive contamination that may adversely affect drive reliability, and their use is environmentally undesirable for workers.

BRIEF SUMMARY OF THE INVENTION

It is an object of the invention to provide in disk drive suspension interconnects a highly conductive connection between e.g. copper/gold and stainless steel components of a disk drive suspension. It is a further object to provide novel and improved methods of manufacturing disk drive suspensions having this highly conductive connection using conductive adhesive-free, metallized vias extending between the copper/gold and stainless steel components of a disk drive suspension. A further object is to ground a disk drive suspension slider to a stainless steel layer using the novel vias of the invention. Yet another object is the manufacture of disk drive suspension interconnects with stainless steel layer grounded components using vias having an improved, low resistance electrical connection. A further object comprises a metallizing modification of the vias to enhance copper/stainless steel bonding and electrical connection thereby. A further object is to facilitate addition of further circuit layers through the effective use of the invention via technology. A further object is to provide substantially planar via openings to enhance the bond-affixing of other components.

These and other objects to become apparent hereinafter are realized in accordance with the invention method of manufacturing a disk drive suspension interconnect comprising a metal grounding layer, a metal conductive layer and an insulative layer between the metal grounding layer and the conductive metal layer, and a circuit component electrically connected to the conductive layer, that includes defining a grounding path from the circuit component and the conductive layer to the metal grounding layer through an aperture in the insulative layer, depositing a tie layer through the insulative layer onto the grounding layer in bonding relation with the ground layer, and depositing a conductor onto both the conductive metal layer and the tie layer in conductive metal layer and tie layer bonding relation, whereby the circuit component is bonded to the grounding layer by the conductor.

In this and like embodiments, typically, the method includes selecting a stainless steel material as the grounding layer, selecting a copper material as the metal conductive layer, selecting a synthetic organic polymer as the insulative layer, such as a polyimide, selecting a copper material as the conductor, selecting a chromium material as the tie layer, depositing a seed copper material layer with the tie layer, electrodepositing a copper material layer with the seed copper material layer, and selecting a slider as the circuit component.

The invention further provides a disk drive suspension interconnect comprising a metal grounding layer, a metal conductive layer and an insulative layer between the metal grounding layer and the conductive metal layer, and a circuit component electrically connected to the conductive layer, the insulative layer defining an aperture providing a grounding path from the circuit component and the conductive layer to the metal grounding layer, a tie layer bonded to the grounding layer within the aperture, and a conductor bonded to the grounding layer through the tie layer and to the conductive metal layer in circuit component grounding bonding relation.

In this and like embodiments, typically, the grounding layer comprises stainless steel, the metal conductive layer comprises copper, the insulative layer comprises a synthetic organic polymer, such as a polyimide, the conductor comprises copper, the tie layer comprises chromium, there is also a seed layer comprising copper within the aperture and a copper layer electrodeposited onto the copper seed layer, and the circuit component comprises a slider.

BRIEF DESCRIPTION OF THE SEVERAL VIEWS OF THE DRAWINGS

The invention will be further described in conjunction with the attached drawings in which.

DETAILED DESCRIPTION OF THE INVENTION

The invention provides a simpler and more economical solution than those criticized above for manufacturing suspension interconnects having a reliable electrical connection between the circuit components to be grounded and the grounding layer of a stainless steel foil by creating a metallized via between them. It is well known that there are inherent difficulties in making electrical connections to stainless steel. In the invention, however, these difficulties are avoided or obviated by using a sputtered tie layer such as chromium that can be used to attach a conductor, e.g. copper, attached to a component, e.g. a slider, to a ground such as stainless steel. FIGS. 1-11 show the invention process flow for creating a metal via between the copper circuit and stainless steel layers on a hard disk drive suspension interconnect.

The invention provides a disk drive suspension interconnect having one or more vias connecting electrical components connected or grounded to a ground layer through an insulative layer.

Figure 1:
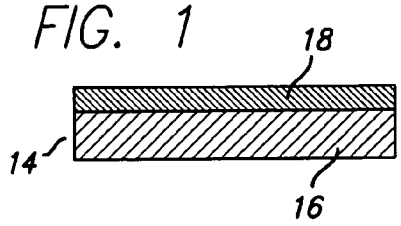
FIGS. 1 through 11 are stages of a process flow according to the invention method with the via configurations modified for illustrative purposes.
Figure 2:
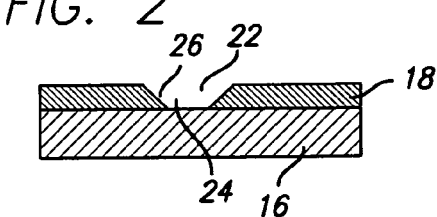
Figure 3:
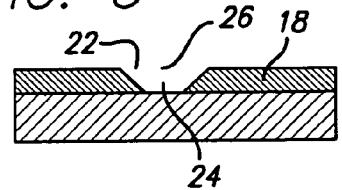

With reference to the drawings, FIGS. 1-14 show the interconnect 12 product and the process of forming the interconnect. The process begins in FIG. 1 with a substrate 14 comprising stainless steel 16 and a typically polyimide or polyester electrically insulative layer 18 that can be cast directly onto the stainless steel. In FIG. 2, a hole 22 where the via 24 is to be formed is shaped as an aperture 26 projecting not more than about 5 microns, mechanically by laser drilling, or chemically by etching, or otherwise, along with any fiducials (not shown) deemed to be needed into the polyimide layer 18, e.g. at a wall slope of preferably about 75 degrees and ranging from about 50 to 60 degrees to about 85 to 90 degrees provided the slope is such that sputtering can be effectively performed to metallize the via. In FIG. 3 the resulting apertured laminate insulative layer 18 is plasma or otherwise cleaned to remove any scum layer left at the bottom of the intended via 24. Hole 22 is relatively small in diameter enabling placement of several on a typically quite small suspension interconnect 12.

Figure 4:
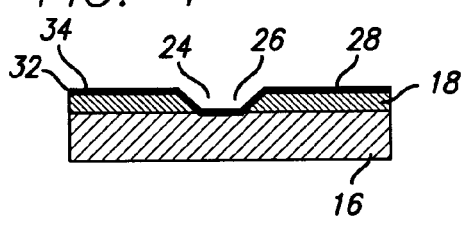

In FIG. 4, a chromium tie layer 28 is sputtered or otherwise deposited onto the insulative layer 18 and into aperture 26. "Chromium" herein includes alloys of chromium in which chromium is the largest single constituent by weight. Monels are useful. Preferably a copper seed layer 32 is further added on top of the polyimide layer 18 and tie layer 28 and down into the aperture 26 from which the via 24 is to be made. Typically a chromium tie layer 28 will be used and will be between 100 Å and 800 Å thick. The copper seed layer 32 when used typically will be between 500 Å and 1500 Å thick.

Figure 5:
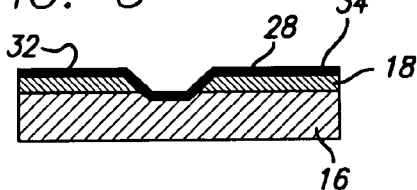

In FIG. 5, a thin layer 34 of copper (including alloys of copper) is electrodeposited in those cases where subsequent high speed plating will be carried out, as the presence of a flash plated copper layer 34 tends to build up the copper seed layer 32 thickness and provide a copper build-up to a thickness between 1 μm and 5 μm which is desirable for high speed copper plating.

Figure 6:
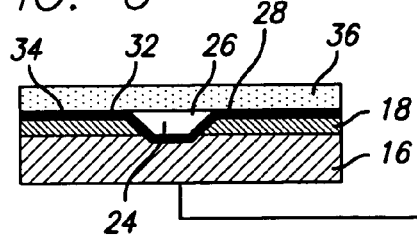

In FIG. 6 a photoresist layer 36 is deposited on top of the tie, seed and electrodeposit layers 28, 32 and 34, respectively.

Figure 7:
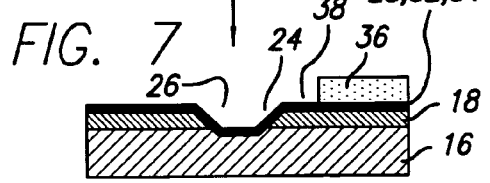

In FIG. 7, after reregistering, the photoresist layer 36 is exposed and developed in a manner leaving openings 38 in the resist layer where circuit features are to be connected to ground.

Figure 8:
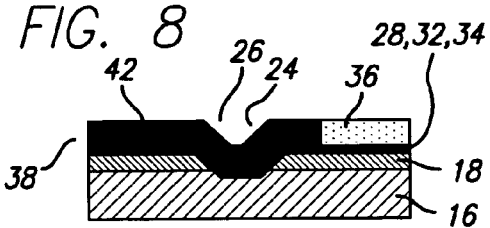

In FIG. 8, openings 38 in the photoresist layer 36 are finally copper plated, e.g. to form a copper plate 42 having a thickness of about 5 to about 15 μm from which suspension interconnect conductive layer comprising conductive traces 44 is formed.

Figure 9:
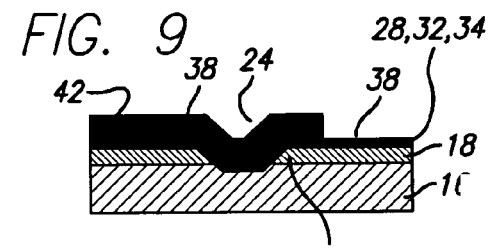

In FIG. 9, the photoresist layer 36 is stripped to expose the flash plated copper layer 34.

Figure 10:
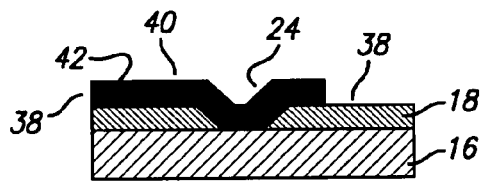

In FIG. 10, a flash etch locally removes the exposed chromium tie layer 28 copper seed layer 32, and electrodeposited flash copper 34, where used, so that the remaining copper circuit features 40 are electrically isolated. Suitable etchants for the etch step include potassium permanganate for the chromium tie layer and cupric chloride for the copper layers.

Figure 11:
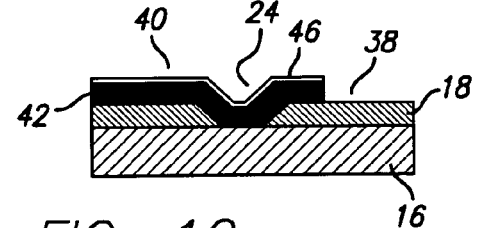

In FIG. 11, the copper features 40 are plated with gold layer 46 producing the metallized via 38 of the invention.

Figure 12:
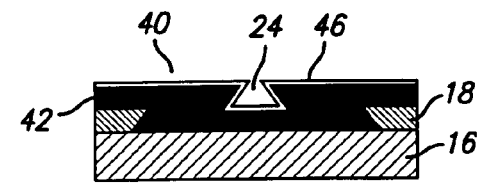
FIG. 12 is a view like FIG. 11, but of a more typical configuration of the via realized in accordance with the invention.

In FIG. 12, a more typical configuration of the via is depicted with like numerals to those numerals in FIGS. 1-11 for like parts.

Figures 13, 14:
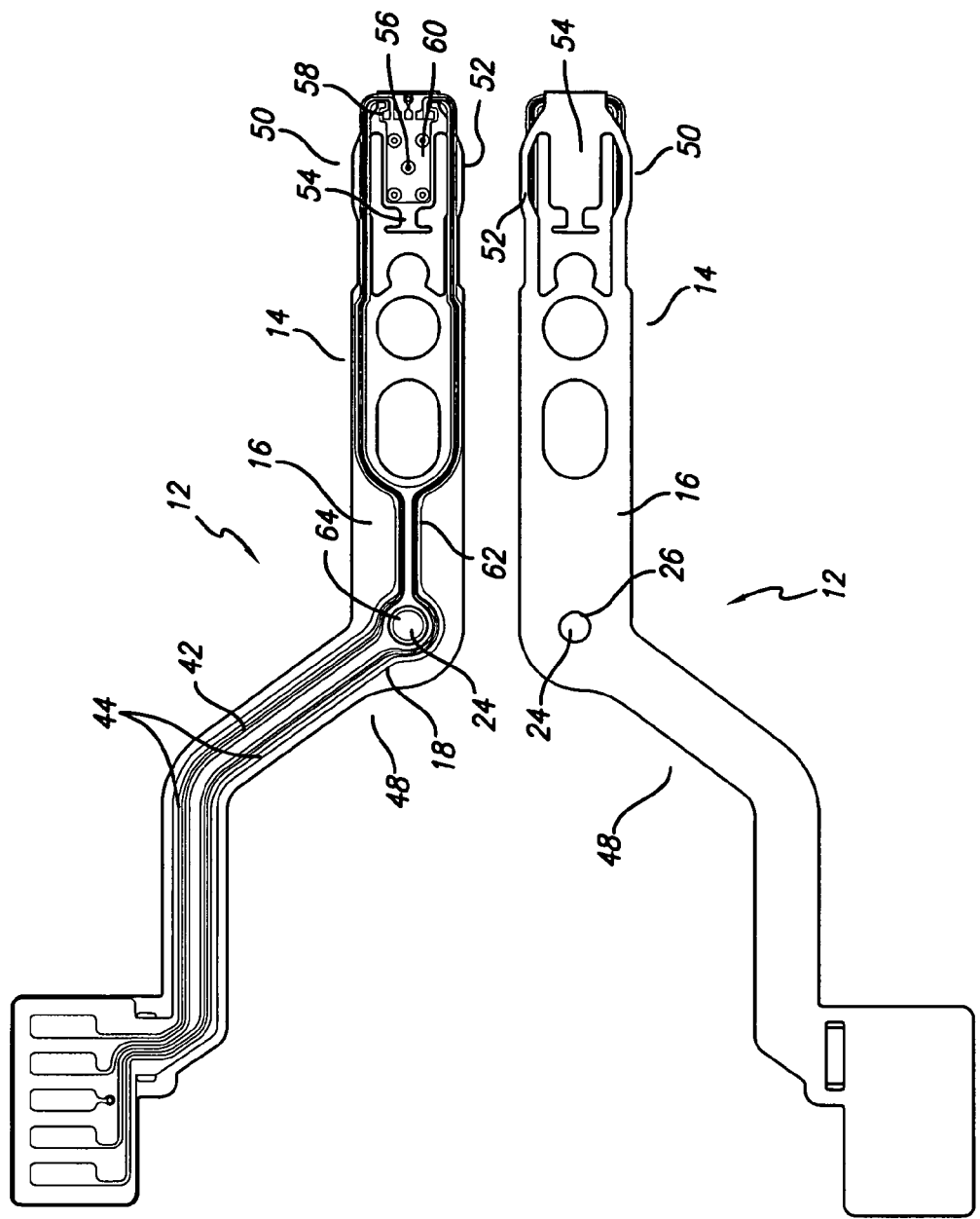
FIG. 13 is a bottom plan view of a disk drive suspension interconnect according to the invention.
FIG. 14 is a top plan view thereof.

With further reference to FIGS. 12 and 13, suspension interconnect 12 comprises a flexible circuit 48 of typically a substrate 14 comprising a stainless steel metal layer 16 and a cast coating of a polyimide layer 18 and conductive traces 44 formed from the copper plate layer 42. Suspension interconnect 12 includes a flexure 50 formed from the substrate metal layer 16 to have a frame 52 and a tongue 54 supporting a slider 60 electrically connected to the conductive traces 44 at 58. For purposes of grounding a circuit component 56 such as the slider 60 to metal layer 16, via 24 connects a grounding lead 62 extending from the slider to the via and through the metallized via to the stainless steel metal layer 16 which is itself grounded by means not shown.

Thus, the invention method of manufacturing a disk drive suspension interconnect 12 comprising a metal grounding layer 16, a metal conductive layer comprising trace conductors 44 and an insulative layer such as polyimide layer 18 between the metal grounding layer and the conductive metal layer, and a circuit component 58 such as a slider 60 electrically connected to the conductive layer traces, includes defining a grounding path 64 from the circuit component and the conductive layer to the metal grounding layer through an aperture 26 in the insulative layer, depositing a tie layer 28 through the insulative layer onto the grounding layer in bonding relation with the grounding layer, and depositing a conductor 42 onto both the conductive metal layer and the tie layer in conductive metal layer and tie layer bonding relation, whereby the circuit component is bonded to the grounding layer by the conductor.

In a further embodiment, a disk drive suspension interconnect 12 is provided comprising a metal grounding layer 16, a metal conductive layer 42 and an insulative layer 18 between the metal grounding layer and the conductive metal layer, and a circuit component 58 electrically connected to the conductive layer, the insulative layer defining an aperture 26 providing a grounding path 64 from the circuit component and the conductive layer to the metal grounding layer, a tie layer 28 bonded to the grounding layer within the aperture, and a conductor 42 bonded to the grounding layer through the tie layer and to the conductive metal layer in circuit component grounding bonding relation.

In the foregoing embodiments, the method further includes selecting a stainless steel material as the grounding layer 16, selecting a copper material as the metal conductive layer 42, selecting a synthetic organic polymer as the insulative layer 18, such as polyimide, selecting a chromium material as the tie layer 28, depositing a seed copper material layer 32, with the tie layer, electrodepositing a copper material layer 34 with the seed copper material layer, and selecting a slider 60 as the circuit component 56. Copper, a copper material, chromium, a chromium material, stainless steel or a stainless steel material, etc. herein includes materials in which the named element or alloy is the largest single constituent by weight.

The invention thus provides in disk drive suspension interconnects a highly conductive connection between e.g. copper/gold and stainless steel components of a disk drive suspension, novel and improved methods of manufacturing disk drive suspension interconnects having this highly conductive connection using conductive adhesive-free, metallized vias extending between the copper/gold and stainless steel components of a disk drive suspension for grounding, in a particular case, a disk drive suspension slider to a stainless steel layer using the novel vias of the invention. The invention further provides a method for the manufacture of disk drive suspension interconnects with stainless steel layer grounded components using vias having an improved, low resistance electrical connection, specifically, metallized, modified vias to enhance copper/stainless steel bonding and electrical connection of suspension components thereby.

The foregoing objects are thus met.

We claim:

1. A disk drive suspension interconnect comprising a stainless steel grounding layer, a synthetic organic polymer layer on the stainless steel grounding layer, the synthetic organic polymer layer having an aperture therethrough, the synthetic organic polymer layer having walls defining the aperture therethrough, the organic polymer layer walls having wall slopes of less than 90 degrees, a chromium layer sputtered directly onto the stainless steel grounding layer within the aperture for facilitating an electrical contact to the stainless steel grounding layer within the aperture, a metal conductive layer bonded to the sputtered chromium layer within the aperture, an electrodeposited copper layer on the synthetic organic polymer layer and the metal conductive layer, and a circuit component electrically connected to the electrodeposited copper layer, the sputtered chromium layer and the metal conductive layer being disposed at least partially within the aperture of the synthetic organic polymer layer, the aperture being substantially filled with metal without the need for conductive adhesive within the aperture, the chromium layer and the metal conductive layer and the electrodeposited copper layer together providing an electrical ground path from the electrical component to the stainless steel grounding layer thereby grounding the electrical component to the stainless steel grounding layer.

2. The disk drive suspension interconnect according to claim 1, in which said synthetic organic polymer comprises polyimide.

3. The disk drive suspension interconnect according to claim 1, in which said metal conductive layer comprises copper.

4. The disk drive suspension interconnect according to claim 1, including also a seed layer comprising copper within said aperture.

5. The disk drive suspension interconnect according to claim 1, in which said circuit component comprises a slider.

6. The disk drive suspension interconnect according to claim 1, wherein the aperture wall slopes are less than 85 degrees.

7. The disk drive suspension interconnect according to claim 1, wherein the aperture wall slopes are between 50 and 85 degrees.

8. A disk drive suspension interconnect comprising a stainless steel grounding layer, an insulative layer on the stainless steel grounding layer, the insulative layer having an aperture therethrough, a Monel metal layer sputtered directly onto the stainless steel grounding layer within the aperture for facilitating an electrical contact to the stainless steel grounding layer within the aperture, a metal conductive layer bonded to the sputtered Monel layer within the aperture, an electrodeposited copper layer on the insulative layer and on the metal conductive layer, and a circuit component electrically connected to the electrodeposited copper layer, the sputtered Monel layer and the metal conductive layer being disposed at least partially within the aperture of the insulative layer, the aperture being substantially filled with metal without the need for conductive adhesive within the aperture, the Monel layer and the metal conductive layer and the electrodeposited copper layer together providing an electrical ground path from the electrical component to the stainless steel grounding layer thereby grounding the electrical component to the stainless steel grounding layer.

9. The disk drive suspension interconnect according to claim 8, further comprising a gold layer on the electrodeposited copper layer.

10. The disk drive suspension interconnect according to claim 8, wherein the insulative layer is polyester.

11. The disk drive suspension interconnect according to claim 8, wherein the insulative layer is polyimide.

12. The disk drive suspension interconnect according to claim 8, wherein the insulative layer has walls defining the aperture therethrough, the walls having wall slopes of less than 90 degrees.

13. The disk drive suspension interconnect according to claim 12 wherein the wall slopes are less than 85 degrees.

14. The disk drive suspension interconnect according to claim 12, wherein the wall slopes are between 60 and 85 degrees.

15. A disk drive suspension interconnect comprising a stainless steel grounding layer, a synthetic organic polymer layer on the stainless steel grounding layer, the synthetic organic polymer layer having an aperture therethrough, the synthetic organic polymer layer having walls defining the aperture therethrough, the organic polymer layer walls having wall slopes of between 60 and 85 degrees, a chromium layer sputtered directly onto the stainless steel grounding layer within the aperture for facilitating an electrical contact to the stainless steel grounding layer within the aperture, a metal conductive layer bonded to the sputtered chromium layer within the aperture, an electrodeposited copper layer on the synthetic organic polymer layer and on the metal conductive layer, and a circuit component electrically connected to the electrodeposited copper layer, the sputtered chromium layer and the metal conductive layer being disposed at least partially within the aperture of the synthetic organic polymer layer, the aperture being substantially filled with metal without the need for conductive adhesive within the aperture, the chromium layer and the metal conductive layer and the electrodeposited copper layer together providing an electrical ground path from the electrical component to the stainless steel grounding layer thereby grounding the electrical component to the stainless steel grounding layer.

16. The disk drive suspension interconnect of claim 15 wherein the metal conductive layer comprises a copper seed layer.

17. The disk drive suspension interconnect of claim 16 further comprising a flash plated copper layer flash plated on the copper seed layer, the flash plated copper layer having a thickness of between 1 µm and 5 µm.

18. The disk drive suspension interconnect of claim 15 wherein the electrodeposited copper substantially fills the aperture.

19. The disk drive suspension interconnect of claim 15 where the metal conductive layer has a thickness of between 100 Å and 800 Å.

20. The disk drive suspension interconnect according to claim 15, wherein the aperture wall slopes are about 75 degrees.

* * * * *